(12) United States Patent
O'Connor et al.

(10) Patent No.: US 11,198,263 B2
(45) Date of Patent: Dec. 14, 2021

(54) MELT PROCESSABLE THERMOPLASTIC COMPOSITE COMPRISING A MULTIMODAL DIELECTRIC FILLER

(71) Applicant: ROGERS CORPORATION, Chandler, AZ (US)

(72) Inventors: Stephen O'Connor, West Roxbury, MA (US); Murali Sethumadhavan, Acton, MA (US)

(73) Assignee: ROGERS CORPORATION, Chandler, AZ (US)

( * ) Notice: Subject to any disclaimer, the term of this patent is extended or adjusted under 35 U.S.C. 154(b) by 192 days.

(21) Appl. No.: 16/357,929

(22) Filed: Mar. 19, 2019

(65) Prior Publication Data
US 2019/0291364 A1  Sep. 26, 2019

Related U.S. Application Data

(60) Provisional application No. 62/646,406, filed on Mar. 22, 2018.

(51) Int. Cl.
| | |
|---|---|
| *B29C 70/58* | (2006.01) |
| *C08K 3/22* | (2006.01) |
| *C08K 3/36* | (2006.01) |
| *B29C 70/88* | (2006.01) |
| *H01B 3/44* | (2006.01) |
| *H01B 3/42* | (2006.01) |
| *C08K 7/00* | (2006.01) |
| *C08K 3/10* | (2018.01) |
| *H01B 3/30* | (2006.01) |
| *C08L 71/00* | (2006.01) |
| *C08K 3/013* | (2018.01) |
| *H01B 3/00* | (2006.01) |
| *B29K 509/00* | (2006.01) |
| *B29K 505/08* | (2006.01) |
| *B29K 101/12* | (2006.01) |
| *B29K 81/00* | (2006.01) |
| *B29K 79/00* | (2006.01) |
| *B29K 223/00* | (2006.01) |
| *B29K 71/00* | (2006.01) |
| *B29L 31/34* | (2006.01) |
| *C08K 3/38* | (2006.01) |
| *C08G 73/10* | (2006.01) |
| *H05K 1/03* | (2006.01) |
| *C08L 79/08* | (2006.01) |
| *C08G 73/14* | (2006.01) |

(52) U.S. Cl.
CPC ............ *B29C 70/58* (2013.01); *B29C 70/882* (2013.01); *C08K 3/013* (2018.01); *C08K 3/10* (2013.01); *C08K 3/22* (2013.01); *C08K 3/36* (2013.01); *C08K 7/00* (2013.01); *C08L 71/00* (2013.01); *H01B 3/006* (2013.01); *H01B 3/301* (2013.01); *H01B 3/306* (2013.01); *H01B 3/427* (2013.01); *H01B 3/441* (2013.01); *B29K 2071/00* (2013.01); *B29K 2079/08* (2013.01); *B29K 2081/04* (2013.01); *B29K 2081/06* (2013.01); *B29K 2101/12* (2013.01); *B29K 2223/06* (2013.01); *B29K 2505/08* (2013.01); *B29K 2509/00* (2013.01); *B29K 2995/0006* (2013.01); *B29L 2031/3456* (2013.01); *C08G 73/1046* (2013.01); *C08G 73/14* (2013.01); *C08K 2003/2241* (2013.01); *C08K 2003/385* (2013.01); *C08K 2201/005* (2013.01); *C08L 79/08* (2013.01); *H05K 1/0373* (2013.01); *H05K 2201/0209* (2013.01); *H05K 2201/0266* (2013.01)

(58) Field of Classification Search
None
See application file for complete search history.

(56) References Cited

U.S. PATENT DOCUMENTS

| | | | |
|---|---|---|---|
| 5,739,193 | A | 4/1998 | Walpita et al. |
| 5,962,122 | A | 10/1999 | Walpita et al. |
| 6,420,476 | B1 | 7/2002 | Yamada et al. |
| 6,476,774 | B1 | 11/2002 | Davidson et al. |
| 6,489,928 | B2 | 12/2002 | Sakurada |
| 6,864,306 | B2 | 3/2005 | Rao et al. |
| 7,164,197 | B2 | 1/2007 | Mao et al. |
| 7,220,481 | B2 | 5/2007 | Satsu et al. |
| 7,247,590 | B2 | 7/2007 | Kawabata et al. |
| 7,326,858 | B2 | 2/2008 | Lee et al. |
| 7,570,491 | B2 | 8/2009 | Lee et al. |
| 7,583,226 | B2 | 9/2009 | Sakurada |

(Continued)

FOREIGN PATENT DOCUMENTS

| | | |
|---|---|---|
| JP | 20012336696 A | 8/2001 |
| JP | 2001250423 A | 9/2001 |

(Continued)

OTHER PUBLICATIONS

Machine Translation of Hisashi et al. JP 2005/126700 p. 1-5 (Year: 2005).*

(Continued)

*Primary Examiner* — Robert T Butcher
(74) *Attorney, Agent, or Firm* — Cantor Colburn LLP (57) ABSTRACT

In an embodiment, a thermoplastic composite comprises a thermoplastic polymer; and a dielectric filler having a multimodal particle size distribution; wherein a peak of a first mode of the multimodal particle size distribution is at least seven times that of a peak of a second mode of the multimodal particle size distribution; and a flow modifier.

20 Claims, 2 Drawing Sheets

(56) References Cited

U.S. PATENT DOCUMENTS

| | | |
|---|---|---|
| 7,700,185 B2 | 4/2010 | Kumashiro |
| 8,025,814 B2 | 9/2011 | Uehara et al. |
| 8,889,776 B2 | 11/2014 | Curry et al. |
| 9,090,479 B2 | 7/2015 | Kuroda et al. |
| 9,556,321 B2 | 1/2017 | Curry et al. |
| 2002/0040085 A1 | 4/2002 | Venigalla et al. |
| 2005/0096429 A1 | 5/2005 | Lee et al. |
| 2006/0142455 A1 | 6/2006 | Agarwal et al. |
| 2006/0258327 A1 | 11/2006 | Lee et al. |
| 2010/0015404 A1 | 1/2010 | Paul et al. |
| 2013/0052453 A1 | 2/2013 | Fi Lou et al. |
| 2015/0047190 A1 | 2/2015 | Curry et al. |
| 2015/0099833 A1 | 4/2015 | Thunhorst et al. |
| 2017/0162325 A1 | 6/2017 | Wang et al. |

FOREIGN PATENT DOCUMENTS

| | | |
|---|---|---|
| JP | 2001279014 A | 10/2001 |
| JP | 2002037667 A | 2/2002 |
| JP | 2003128930 A | 5/2003 |
| JP | 2003151352 A | 5/2003 |
| JP | 2003213146 A | 7/2003 |
| JP | 2004006316 A | 8/2004 |
| JP | 2005/126700 * | 5/2005 |
| JP | 2005126700 A | 5/2005 |
| JP | 2006019198 A | 1/2006 |
| JP | 2006019621 A | 1/2006 |
| JP | 2007009172 A | 1/2007 |
| JP | 2010270270 A | 12/2010 |
| JP | 2010270271 A | 12/2010 |
| WO | 9720324 | 6/1997 |
| WO | 9826431 | 6/1998 |

OTHER PUBLICATIONS

International Search Report; International Application No. PCT/US2019/023120; International Filing Date: Mar. 20, 2019; dated: Jun. 14, 2019; 9 pages.

Written Opinion; International Application No. PCT/US2019/023120; International Filing Date: Mar. 20, 2019; dated: Jun. 14, 2019; 13 pages.

* cited by examiner

MELT PROCESSABLE THERMOPLASTIC COMPOSITE COMPRISING A MULTIMODAL DIELECTRIC FILLER

CROSS-REFERENCE TO RELATED APPLICATION

This application claims the benefit of U.S. Provisional Patent Application Ser. No. 62/646,406 filed Mar. 22, 2018, which is incorporated herein in its entirety by reference.

BACKGROUND

The present disclosure relates generally to a melt processable thermoplastic composite.

For any melt processable thermoplastic composite, there exists a temperature dependent critical shear rate, above which the surface of the melt processed material is rough and below which the surface of the melt processed material is smooth. The desire for a smooth melt processed material surface competes with the economic advantages of melt processing the composition at the fastest possible speed (for example, at high shear rates). As the amount of a dielectric filler increases in a thermoplastic composite, this critical shear rate decreases and the composition becomes increasingly more difficult to melt process. As a result, it is extremely difficult to achieve a melt processable thermoplastic composite with increased amount of dielectric filler, which ultimately limits several potential advantages of using ceramic fillers in thermoplastic composites like the dielectric constant, the coefficient of thermal expansion, and the like.

Accordingly, there remains a need in the art for high dielectric constant materials made from melt processable thermoplastic composites. It would be advantageous if the melt processable thermoplastic composite displayed one or more of improved melt processability and improved mechanical properties.

BRIEF SUMMARY

Disclosed herein is a thermoplastic composite and a method of making the same and using the same.

In an embodiment, the thermoplastic composite comprises a thermoplastic polymer; and a dielectric filler having a multimodal particle size distribution; wherein a peak of a first mode of the multimodal particle size distribution is at least seven times that of a peak of a second mode of the multimodal particle size distribution; and a flow modifier.

Methods of forming the thermoplastic composition can include injection molding, printing, and extruding.

Articles comprising the thermoplastic composite can include an antenna and a filament.

The above features and advantages and other features and advantages are readily apparent from the following detailed description, figures, and claims.

BRIEF DESCRIPTION OF THE DRAWINGS

The following Figures are exemplary embodiments, which are provided to illustrate the present disclosure. The figures are illustrative of the examples, which are not intended to limit devices made in accordance with the disclosure to the materials, conditions, or process parameters set forth herein.

DETAILED DESCRIPTION

Thermoplastic composites having a high concentration of dielectric filler tend to be viscous, even at high processing temperatures of, for example, more than 300 degrees Celsius (° C.) and are therefore very difficult to melt process. For example, thermoplastic composites comprising greater than 40 volume percent (vol %) of a titanium dioxide are often difficult or are even not able to be injection molded. It was surprisingly discovered that merely by exchanging a portion of the dielectric filler with a dielectric filler having a different particle size, that the viscosity of the thermoplastic composite can be reduced. This reduction in viscosity can ultimately allow for the thermoplastic composite to be more easily injection molded and having a smoother molded surface. Specifically, it was found that a thermoplastic composite comprising a thermoplastic polymer; and a dielectric filler having a multimodal particle size distribution; wherein a peak of a first mode of the multimodal particle size distribution is at least seven times that of a peak of a second mode of the multimodal particle size distribution resulted in lower viscosity composite.

The improved moldability was beneficially achieved without resulting in a decrease in the dielectric properties of the thermoplastic composite. For example, the thermoplastic composite can have a dielectric constant (also commonly referred to as the relative permittivity) of greater than or equal to 5, or greater than or equal to 10, or 10 to 20 at 500 megahertz (MHz) to 10 gigahertz (GHz), or 15 to 25 at 500 MHz to 10 GHz at 23° C., which was generally otherwise only obtained using thermoset polymers. Furthermore, it was surprisingly discovered that the thermoplastic composite comprising the multimodal distribution of the dielectric filler also resulted in an improvement in mechanical properties. For example, a thermoplastic composite comprising 40 vol % of the multimodal dielectric filler can display ductile failure modes, whereas a corresponding thermoplastic composite comprising the same amount of a single modal dielectric filler displays brittle failure modes.

The thermoplastic composite can comprise a thermoplastic polymer. The thermoplastic polymer can include oligomers, polymers, ionomers, dendrimers, copolymers (for example, graft copolymers, random copolymers, block copolymers (for example, star block copolymers and random copolymers)), and combinations comprising at least one of the foregoing. The thermoplastic polymer can be semi-crystalline or amorphous. The thermoplastic polymer can have a dielectric loss (also referred to as the dissipation factor) of less than or equal to 0.007, or less than or equal to 0.006, or 0.0001 to 0.007 at a frequency of 500 MHz to 100 GHz, or 500 MHz to 10 GHz at 23° C. The thermoplastic polymer can have a heat deflection temperature of greater than or equal to 55° C., or 55 to 250° C. as determined in accordance with ASTM D648-18 at 1.8 MPa. The thermoplastic polymer can have a glass transition temperature of greater than or equal to 50 to 300° C., or 80 to 300° C. as determined in accordance with ASTM E1545-11 (2016).

The thermoplastic composite can comprise 10 to 90 vol %, or 20 to 80 vol %, or 20 to 70 vol %, or 20 to 60 vol %, or 30 to 50 vol % of the thermoplastic polymer based on the total volume of the thermoplastic composite.

The thermoplastic polymer can comprise a polycarbonate, a polystyrene, a poly(phenylene ether), a polyimide (for example, polyetherimide), a polybutadiene, a polyacrylonitrile, a poly($C_{1-12}$alkyl)methacrylate (for example, polymethylmethacrylate (PMMA)), a polyester (for example, poly(ethylene terephthalate), polybutylene terephthalate), polythioester), a polyolefin (for example, polypropylene (PP), high density polyethylene (HDPE), low density polyethylene (LDPE), linear low density polyethylene (LLDPE)), a polyamide (for example, polyamideimide), a polyarylate, a polysulfone (for example, polyarylsulfone, polysulfonamide), a poly(phenylene sulfide), a poly(phenylene oxide), a polyether (for example, poly(ether ketone) (PEK), poly(ether ether ketone) (PEEK), polyethersulfone (PES)), a poly(acrylic acid), a polyacetal, a polybenzoxazole (for example, polybenzothiazole, polybenzothiazinophenothiazine), a polyoxadiazole, a polypyrazinoquinoxaline, a polypyromellitimide, a polyquinoxaline, a polybenzimidazole, a polyoxindole, a polyoxoisoindoline (for example, polydioxoisoindoline), a polytriazine, a polypyridazine, a polypiperazine, a polypyridine, a polypiperidine, a polytriazole, a polypyrazole, a polypyrrolidine, a polycarborane, a polyoxabicyclononane, a polydibenzofuran, a polyphthalide, a polyacetal, a polyanhydride, a vinyl polymer (for example, a poly(vinyl ether), a poly(vinyl alcohol), a poly(vinyl ketone), a poly(vinyl halide) (for example, poly(vinyl chloride)), a poly(vinyl nitrile), a poly(vinyl ester)), a polysulfonate, a fluoropolymer (for example, polyvinylidene fluoride (PVDF), fluorinated ethylene-propylene (FEP), polyethylenetetrafluoroethylene (PETFE)), or a combination comprising at least one of the foregoing. The thermoplastic polymer can comprise a poly(aryl)etherketone (for example, poly(ether ketone), poly(ether ether ketone), and poly(ether ketone ketone)), a polysulfone (a, for example, poly(ether sulfone)), a poly(phenylene sulfide), a poly(ether imide), a poly(amide imide), a fluoropolymer, or a combination comprising at least one of the foregoing. The thermoplastic polymer can comprise a polyolefin. The thermoplastic polymer can comprise a combination comprising at least one of the foregoing polymers.

The thermoplastic polymer can comprise a poly(aryl) etherketone, for example, poly(ether ketone), poly(ether ether ketone), and poly(ether ketone ketone). For example, the thermoplastic polymer can comprise poly(ether ether ketone). The poly(ether ether ketone) can have a melt flow rate (MRF) of 40 to 50 grams per 10 minutes (g/10 min) as determined in accordance with ASTM D1238-13, Procedure A, at a load of 2.16 kilograms (kg) at 400° C.

The thermoplastic polymer can comprise a polyolefin. The polyolefin can comprise a low density polyethylene. The polyolefin can comprise a cyclic olefin copolymer (for example, a copolymerization product of norbornene and ethylene using a metallocene catalyst), optionally in combination with a linear polyolefin. The cyclic olefin copolymer can have one or more of a tensile strength at yield of 40 to 50 megapascal (MPa) at 5 millimeters per minute (mm/min) as measured in accordance with ISO 527-2/1A:2012; a dielectric constant of 2 to 2.5 at a frequency of 1 to 10 kilohertz (kHz) as determined in accordance with IEC 60250; and a heat deflection temperature of greater than or equal to 125° C., for example, 135 to 160° C. at 0.46 MPa, as determined in accordance with ISO 75-1, -2:2004.

The thermoplastic composite can comprise a liquid crystalline polymer. Liquid crystalline polymers (sometimes abbreviated as "LCP") are a class of polymers well known for a variety of uses. Liquid crystalline polymers often comprise thermoplastic resins, although they can also be used as thermosets by functionalization or by compounding with a thermoset, for example, an epoxy. Liquid crystalline polymers are believed to have a fixed molecular shape (for example, linear) due to the nature of the repeating units in the polymeric chain. The repeating units typically comprise rigid molecular elements. The rigid molecular elements (mesogens) are frequently rod-like or disk-like in shape and are typically aromatic and frequently heterocyclic. The rigid molecular elements can be present in one or both of the main chain (backbone) of the polymer and in the side chains. The rigid molecular elements can be separated by more flexible molecular elements, sometimes referred to as spacers.

Examples of commercial liquid crystalline polymers include, but are not limited to VECTRA™ and ZENITE™ commercially available from Celanese, and XYDAR™ commercially available from Solvay Specialty Polymers, and those available from RTP Co., for example, the RTP-3400 series liquid crystalline polymers.

The thermoplastic composite can comprise 10 to 90 vol %, or 20 to 80 vol %, or 20 to 70 vol %, or 20 to 60 vol %, or 10 to 20 vol % of the liquid crystalline polymer based on the total volume of the thermoplastic composite. The thermoplastic composite can comprise 20 to 80 vol %, or 40 to 80 vol % of a thermoplastic polymer other than the liquid crystalline polymer and 10 to 20 vol % of the liquid crystalline polymer based on the total volume of the thermoplastic composite.

The thermoplastic composite comprises a dielectric filler that can be selected to adjust the dielectric constant, dissipation factor, coefficient of thermal expansion, and other properties of the composition. The dielectric filler has a multimodal particle size distribution, wherein a peak of a first mode of the multimodal particle size distribution is at least seven times that of a peak of a second mode of the multimodal particle size distribution. The multimodal particle size distribution can be, for example, bimodal, trimodal, or quadramodal. In other words, the dielectric filler comprises a first plurality of particles having a first average particle size and a second plurality of particles having a second average particle size; wherein the first average particle size is greater than or equal to 7 times, or greater than or equal to 10 times, or 7 to 60 times the second average particle size, or 7 to 20 times the second average particle size. As used herein, the term particle size refers to a diameter of a sphere having the same volume as the particle and the average particle size refers to a number average of the particle sizes of the plurality of particles. The peak of the first mode (the first average particle size) can be greater than or equal to 2 micrometers, or 2 to 20 micrometers. The peak of the second mode (the second average particle size) can be greater than or equal to 0.2 micrometers, or less than or equal to 2 micrometers, or 0.2 to 1.5 micrometers.

The first plurality of particles and the second plurality of particles can comprise the same dielectric filler. For example, first plurality of particles and the second plurality of particles can comprise titanium dioxide. Conversely, the first plurality of particles and the second plurality of particles can comprise different dielectric fillers. For example, the first plurality of particles can comprise silica and the second plurality of particles can comprise titanium dioxide.

The first plurality of particles can have an average particle size of 1 to 10 micrometers, or 2 to 5 micrometers. The second plurality of particles can have an average particle size of 0.01 to 1 micrometer, or 0.1 to 0.5 micrometers. The dielectric filler can comprise a first plurality of particles comprising titanium dioxide having an average particle size of 1 to 10 micrometers and a second plurality of particles having an average particle size of 0.1 to 1 micrometer.

The thermoplastic composite can comprise 10 to 90 vol %, or 20 to 80 vol %, or 30 to 80 vol %, or 40 to 80 vol % of the dielectric filler based on the total volume of the thermoplastic composite. The thermoplastic composite can comprise 25 to 45 vol %, or 30 to 40 vol % of the first plurality of particles and 10 to 25 vol %, or 10 to 20 vol % of the second plurality of particles; both based on the total volume of the thermoplastic composite. The dielectric filler can comprise 10 to 90 vol %, or 50 to 90 vol %, or 60 to 80 vol % of the first plurality of particles based on the total volume of the dielectric filler. The dielectric filler can comprise 10 to 90 vol %, or 10 to 50 vol %, or 20 to 40 vol % of the second plurality of particles based on the total volume of the dielectric filler.

The dielectric filler can comprise titanium dioxide (for example, rutile and anatase), barium titanate, strontium titanate, silica (for example, fused amorphous silica), corundum, wollastonite, $Ba_2Ti_9O_{20}$, solid glass spheres, hollow microspheres (for example, hollow glass spheres and hollow ceramic spheres), quartz, boron nitride, aluminum nitride, silicon carbide, beryllia, alumina, alumina trihydrate, magnesia, mica, talc, nanoclay, magnesium hydroxide, or a combination comprising at least one of the foregoing. The dielectric filler can comprise titanium dioxide, silica, barium titanate, or a combination comprising at least one of the foregoing. The dielectric filler can comprise hollow microspheres. A shape of the dielectric filler can be one or more of spherical, platelet, or irregular, for example, as agglomerate. The dielectric filler can be free of a fibrous component.

The dielectric filler can comprise a treated titanium dioxide. For example, the titanium dioxide can be sintered to increase the amount of a desired phase. Without wishing to be bound by theory, it is believed that the sintering may help the composition to achieve a lower dielectric loss. A first plurality of titanium dioxide particles having an average particle size of 1 to 10 micrometers, or 2 to 5 micrometers can be sintered. A first plurality of titanium dioxide particles having an average particle size of 0.1 to 1 micrometers, or 0.1 to 0.5 micrometers can be sintered.

If the dielectric filler comprises a plurality of hollow microspheres, then a first plurality of the hollow microspheres can have an average outer diameter of 70 to 300 micrometers, or 10 to 200 micrometers, and the second plurality of the hollow microspheres can have an average outer diameter of 10 to 50 micrometers, or 20 to 45 micrometers. The density of the hollow microspheres can be greater than or equal to 0.1 grams per cubic centimeter (g/cc), or 0.2 to 0.6 g/cc, or 0.3 to 0.5 g/cc. Hollow microspheres are available from a number of commercial sources, for example, from Trelleborg Offshore (Boston), formerly Emerson and Cuming, Inc., W.R. Grace and Company (Canton, Mass.), and 3M Company (St. Paul, Minn.). Such hollow microspheres are also referred to as microballoons, glass bubbles, and microbubbles and are sold in various grades, for example, which can vary according to density, size, coatings, and/or surface treatments. The hollow microspheres can comprise ceramic hollow microspheres, polymeric hollow microspheres, glass hollow microspheres (for example, those made of an alkali borosilicate glass), or a combination comprising one or more of the foregoing.

The dielectric filler can be surface treated with a silicon-containing coating, for example, an organofunctional alkoxy silane coupling agent. A zirconate or titanate coupling agent can be used. Such coupling agents can improve the dispersion of the filler in the thermoplastic composite and reduce water absorption of an article made therefrom.

The silane coating can be formed from a silane, which can comprise a linear silane, a branched silane, a cyclosilane, or a combination comprising at least one of the foregoing. The silane can comprise a precipitated silane. The silane can be free of a solvent (for example, toluene) or a dispersed silane, for example, the silane can comprise 0 to 2 wt % (for example, 0 wt %) of a solvent dispersed silane based on the total weight of the silane.

A variety of different silanes can be used to form the coating, including one or both of a phenylsilane and a fluorosilane. The phenylsilane can be p-chloromethyl phenyl trimethoxy silane, phenyl trimethoxy silane, phenyl triethoxy silane, phenyl trichlorosilane, phenyl-tris-(4-biphenylyl) silane, hexaphenyldisilane, tetrakis-(4-biphenylyl)silane, tetra-Z-thienylsilane, phenyltri-Z-thienylsilane, 3-pyridyltriphenylsilane, or a combination comprising at least one of the foregoing. Functionalized phenylsilanes as described in U.S. Pat. No. 4,756,971 can also be used, for example, functional phenylsilanes of the formula $R^1SiZ^1Z^2Z^3$ wherein $Z^1$ and $Z^2$ each is independently chlorine, fluorine, bromine, alkoxy with not more than 6 carbon atoms, NH, —$NH_2$, —$NR_2'$, wherein R' is alkyl with 1 to 3 carbon atoms, —SH, —CN, —$N_3$ or hydrogen, and $R^1$ is wherein each of the S-substituents $S_1$, $S_2$, $S_3$, $S_4$ and $S_5$ are independently selected from the group consisting of hydrogen, alkyl with 1 to 4 carbon atoms, methoxy, ethoxy, and cyano, provided that at least one of the S-substituents is other than hydrogen, and when there is a methyl or methoxy S-substituent, then (i) at least two of the S-substituents are other than hydrogen, (ii) two adjacent S-substituents form with the phenyl nucleus a naphthalene or anthracene group, or (iii) three adjacent S-substituents form together with the phenyl nucleus a pyrene group, and X is the group —$(CH_2)_n$—, wherein n is 0 to 20, or 10 to 16 when n is not 0, i.e., X is a spacer group, the S-substituents. The term "lower" in connection with groups or compounds, means 1 to 7, or 1 to 4, carbon atoms.

The fluorosilane coating can be formed from a perfluorinated alkyl silane having the formula: $CF_3(CF_2)_n$—$CH_2CH_2SiX$, wherein X is a hydrolyzable functional group and n=0 or a whole integer. The fluorosilane can be (3,3,3-trifluoropropyl)trichlorosilane, (3,3,3-trifluoropropyl)dimethylchlorosilane, (3,3,3-trifluoropropyl)methyldichlorosilane, (3,3,3-trifluoropropyl)methyldimethoxysilane, (tridecafluoro-1,1,2,2-tetrahydrooctyl)-1-trichlorosilane, (tridecafluoro-1,1,2,2-tetrahydrooctyl)-1-methyldichlorosilane, (tridecafluoro-1,1,2,2-tetrahydrooctyl)-1-dimethylchlorosilane, (heptadecafluoro-1,1,2,2-tetrahydrodecyl)-1-methyldichlorosilane, (heptadecafluoro-1,1,2,2-tetrahydrodecyl)-1-trichlorosilane, heptadecafluoro-1,1,2,2-tetrahydrodecyl)-1-dimethylchlorosilane, (heptafluoroisopropoxy) propylmethyldichlorosilane, 3-(heptafluoroisopropoxy) propyltrichlorosilane, 3-(heptafluoroisopropoxy) propyltriethoxysilane, or a combination comprising at least one of the foregoing.

Other silanes can be used instead of, or in addition to, the phenylsilane and the fluorosilane, for example, aminosilanes and silanes containing polymerizable functional groups, for example, acryl and methacryl groups. Examples of aminosilanes include N-methyl-γ-aminopropyltriethoxysilane, N-ethyl-γ-aminopropyltrimethoxysilane, N-methyl-β-aminoethyltrimethoxysilane, γ-aminopropylmethyldimethoxysilane, N-methyl-γ-aminopropylmethyldimethoxysilane, N-(β-N-methylaminoethyl)-γ-aminopropyltriethoxysilane, N-(γ-aminopropyl)-γ-aminopropylmethyldimethoxysilane, N-(γ-aminopropyl)-N-methyl-γ-aminopropylmethyldimethoxysilane and γ-aminopropylethyldiethoxysilaneaminoethylamino trimethoxy silane, aminoethylamino propyl trimethoxy silane, 2-ethylpiperidinotrimethylsilane, 2-ethylpiperidinomethylphenylchlorosilane, 2-ethylpiperidinodimethylhydridosilane, 2-ethylpiperidinodicyclopentylchlorosilane, (2-ethylpiperidino) (5-hexenyl)methylchlorosilane, morpholinovinylmethylchlorosilane, n-methylpiperazinophenyldichlorosilane, or combinations comprising at least one of the foregoing.

Silanes including a polymerizable functional group include silanes of the formula $R^a_x SiR^b_{(3-x)}R$, in which each $R^a$ is the same or different, for example, the same, and is halogen (for example, Cl and Br), $C_{1-4}$ alkoxy, $C_{2-6}$ acyl, for example, methoxy or ethoxy; each $R^b$ is a $C_{1-8}$ alkyl or $C_{6-12}$ aryl, for example, methyl, ethyl, propyl, butyl, or phenyl; x is 1, 2, or 3, for example, 2 or 3; and R is —$(CH_2)_nOC(=O)C(R^c)=CH_2$, wherein $R^c$ is hydrogen or methyl and n is an integer 1 to 6, for example, 2 to 4. The silane can be methacrylsilane (for example, 3-methacryloxypropyl trimethoxy silane).

The titanate coating can be formed from neopentyl(diallyl)oxy, trineodecanonyl titanate; neopentyl(diallyl)oxy, tri (dodecyl)benzene-sulfonyl titanate; neopentyl(diallyl)oxy, tri(dioctyl)phosphato titanate; neopentyl(diallyl)oxy, tri(dioctyl)pyro-phosphato titanate; neopentyl(diallyl)oxy, tri(N-ethylenediamino) ethyl titanate; neopentyl(diallyl)oxy, tri (m-amino)phenyl titanate; and neopentyl(diallyl)oxy, trihydroxy caproyl titanate; or a combination comprising at least one of the foregoing. The zirconate coating can be formed from neopentyl(diallyloxy)tri(dioctyl) pyro-phosphate zirconate, neopentyl(diallyloxy)tri(N-ethylenediamino) ethyl zirconate, or a combination comprising at least one of the foregoing.

The thermoplastic composite can comprise a flow modifier. The flow modifier can comprise a ceramic filler. The ceramic filler can comprise one or more of the dielectric fillers listed herein provided that it is different from the dielectric filler. For example, the dielectric filler can comprise titanium dioxide and the ceramic filler can comprise boron nitride. The flow modifier can comprise a fluoropolymer (for example, a perfluoropolyether liquid), for example, FLUOROGARD™ commercially available from Chemours USA Fluoroproducts, Wilmington, Del. The flow modifier can comprise a polyhedral oligomeric silsesquioxane (commonly referred to as "POSS", also referred to herein as the "silsesquioxane"). The flow modifier can comprise a combination comprising one or more of the foregoing flow modifiers. The flow modifier can be present in an amount of less than or equal to 5 vol %, or 0.5 to 5 vol %, or 0.5 to 2 vol % based on the total volume of the thermoplastic composite. At these low concentrations, the dielectric constant of the thermoplastic composite will not be significantly affected.

The flow modifier can comprise the silsesquioxane. The silsesquioxane is a nano-sized inorganic material with a silica core that can have reactive functional groups on the surface. The silsesquioxane can have a cube or a cube-like structure comprising silicon atoms at the vertices and interconnecting oxygen atoms. Each of the silicon atoms can be covalently bonded to a pendent R group. Silsesquioxanes, for example, octa(dimethylsiloxy) silsesquioxane ($R_8Si_8O_{12}$), comprise a cage of silicon and oxygen atoms around a core with eight pendent R groups. Each R group independently can be a hydrogen, a hydroxy group, an alkyl group, an aryl group, or an alkene group, where the R group can comprise one to twelve carbon atoms and one or more heteroatoms (for example, oxygen, nitrogen, phosphorus, silicon, a halogen, or a combination comprising at least one of the foregoing). Each R group independently can comprise a reactive group, for example, an alcohol, an epoxy group, an ester, an amine, a ketone, an ether, a halide, or a combination comprising at least one of the foregoing. Each R group independently can comprise a silanol, an alkoxide, a chloride, or a combination comprising at least one of the foregoing. The silsesquioxane can comprise trisilanolphenyl POSS, dodecaphenyl POSS, octaisobutyl POSS, octamethyl POSS, or a combination comprising at least one of the foregoing. The silsesquioxane can comprise trisilanolphenyl POSS.

The thermoplastic composite can comprise an additive, for example, a fibrous filler, a flame retardant, a mold release agent, or a combination comprising at least one of the foregoing. The fibrous filler can comprise a glass fiber, a carbon fiber, a wollastonite fiber, an aluminum borate fiber, a potassium titanate whisker, or a combination comprising at least one of the foregoing. The fibrous filler can comprise a glass fiber, for example, CS03JAPx-1, manufactured by Asahi Fiber Glass Corp. The glass fiber can comprise chopped glass strands. The glass fiber can comprise milled fibers.

The thermoplastic composite can comprise a flame retardant useful for making the thermoplastic composite resistant to flame. The flame retardant can be halogenated or unhalogenated. The flame retardant can be present in the thermoplastic composite in an amount of 0 to 30 vol % based on the volume of the thermoplastic composite.

The flame retardant can be inorganic and can be present in the form of particles. The inorganic flame retardant can comprise a metal hydrate, having, for example, a volume average particle size of 1 to 500 nanometers (nm), or 1 to 200 nm, or 5 to 200 nm, or 10 to 200 nm; alternatively the volume average particle size can be 500 nm to 15 micrometers, for example, 1 to 5 micrometers. The metal hydrate can comprise a hydrate of a metal, for example, Mg, Ca, Al, Fe, Zn, Ba, Cu, Ni, or a combination comprising at least one of the foregoing. Hydrates of Mg, Al, or Ca can be used, for example, aluminum hydroxide, magnesium hydroxide, calcium hydroxide, iron hydroxide, zinc hydroxide, copper hydroxide, and nickel hydroxide; and hydrates of calcium aluminate, gypsum dihydrate, zinc borate, and barium metaborate. Composites of these hydrates can be used, for example, a hydrate containing Mg and at least one of Ca, Al, Fe, Zn, Ba, Cu, and Ni. A composite metal hydrate can have the formula $MgM_x(OH)_y$, wherein M is Ca, Al, Fe, Zn, Ba, Cu, or Ni, x is 0.1 to 10, and y is 2 to 32. The flame-retardant particles can be coated or otherwise treated to improve dispersion and other properties.

Organic flame retardants can be used alternatively or in addition to the inorganic flame retardants. Examples of organic flame retardants include melamine cyanurate, fine particle size melamine polyphosphate, various other phosphorus-containing compounds, for example, aromatic phosphinates, diphosphinates, phosphonates, phosphates, siloxanes, and halogenated compounds (for example, hexachloroendomethylenetetrahydrophthalic acid (HET acid), tetrabromophthalic acid, and dibromoneopentyl glycol). A flame retardant (for example, a bromine-containing flame retardant) can be present in an amount of 20 phr (parts per hundred parts of the thermoplastic composite by weight) to 60 phr, or 30 to 45 phr. Examples of brominated flame retardants include Saytex BT93W (ethylene bistetrabromophthalimide), Saytex 120 (tetradecabromodiphenoxy benzene), and Saytex 102 (decabromodiphenyl oxide). The flame retardant can be used in combination with a synergist, for example, a halogenated flame retardant can be used in combination with a synergist, for example, antimony trioxide, and a phosphorus-containing flame retardant can be used in combination with a nitrogen-containing compound, for example, melamine.

The thermoplastic composite can have a dielectric constant (also known as the dielectric permeability) of greater than or equal to 1.5, or greater than or equal to 2.5, or 1.5 to 8, or 3 to 13, or 3.5 to 8, or 5 to 8 at 500 MHz to 10 GHz. The thermoplastic composite can have a dielectric constant of greater than or equal to 10, or 10 to 20 at 500 MHz to 10 GHz. The thermoplastic composite can have a dielectric loss of less than or equal to 0.007, or less than or equal to 0.005, or 0.001 to 0.005 at 500 MHz to 10 GHz. The dielectric properties can be measured using a coaxial airline with a Nicholsson-Ross extraction from the scatter parameters measured using a vector network analyzer at room temperature of 23° C.

The thermoplastic composite can be melt processed, for example, by injection molding, 3D printing, or extruding. As used herein, the term "melt processable" can refer to any process where the thermoplastic polymer is melted, for example, to a temperature above its glass transition temperature, and then solidified, for example, to a temperature below its glass transition temperature to form a shape. The thermoplastic composite can be formed into an article. The article can be formed using an injection molding process comprising injecting the thermoplastic composite in a molten form into a mold; and cooling the mold to form the article. The method can comprise first forming a mixture comprising the thermoplastic polymer and the dielectric filler; and thoroughly mixing the mixture, wherein the mixture can be melted prior to mixing and/or during mixing.

A circuit material comprising the thermoplastic composite can be prepared by forming a multilayer material having a substrate layer comprising the thermoplastic composite with a conductive layer disposed thereon. Useful conductive layers include, for example, stainless steel, copper, gold, silver, aluminum, zinc, tin, lead, transition metals, and alloys comprising at least one of the foregoing. There are no particular limitations regarding the thickness of the conductive layer, nor are there any limitations as to the shape, size, or texture of the surface of the conductive layer. The conductive layer can have a thickness of 3 to 200 micrometers, or 9 to 180 micrometers. When two or more conductive layers are present, the thickness of the two layers can be the same or different. The conductive layer can comprise a copper layer. Suitable conductive layers include a thin layer of a conductive metal, for example, a copper foil presently used in the formation of circuits, for example, electrodeposited copper foils. The copper foil can have a root mean squared (RMS) roughness of less than or equal to 2 micrometers, or less than or equal to 0.7 micrometers, where roughness is measured using a Veeco Instruments WYCO Optical Profiler, using the method of white light interferometry.

The conductive layer can be applied by placing the conductive layer in the mold prior to molding the thermoplastic composite, by laminating the conductive layer onto the substrate, by direct laser structuring, or by adhering the conductive layer to the substrate via an adhesive layer. Other methods known in the art can be used to apply the conductive layer where permitted by the particular materials and form of the circuit material, for example, electrodeposition, and chemical vapor deposition.

The laminating can entail laminating a multilayer stack comprising the substrate, a conductive layer, and an optional intermediate layer between the substrate and the conductive layer to form a layered structure. The conductive layer can be in direct contact with the substrate layer, without the intermediate layer. The layered structure can then be placed in a press, for example, a vacuum press, under a pressure and temperature and for duration of time suitable to bond the layers and form a laminate. Lamination and optional curing can be by a one-step process, for example, using a vacuum press, or can be by a multi-step process. In a one-step process, the layered structure can be placed in a press, brought up to laminating pressure (for example, 150 to 400 pounds per square inch (psi)) and heated to laminating temperature (for example, 260 to 390° C.). The laminating temperature and pressure can be maintained for a desired soak time, for example, 20 minutes, and thereafter cooled (while still under pressure) to less than or equal to 150° C.

If present, the intermediate layer can comprise a polyfluorocarbon film that can be located in between the conductive layer and the substrate layer, and an optional layer of microglass reinforced fluorocarbon polymer can be located in between the polyfluorocarbon film and the conductive layer. The layer of microglass reinforced fluorocarbon polymer can increase the adhesion of the conductive layer to the substrate. The microglass can be present in an amount of 4 to 30 weight percent (wt %) based on the total weight of the layer. The microglass can have a longest length scale of less than or equal to 900 micrometers, or less than or equal to 500 micrometers. The microglass can be microglass of the type as commercially available by Johns-Manville Corporation of Denver, Colo. The polyfluorocarbon film comprises a fluoropolymer (for example, polytetrafluoroethylene (PTFE), a fluorinated ethylene-propylene copolymer (for example, Teflon FEP), and a copolymer having a tetrafluoroethylene backbone with a fully fluorinated alkoxy side chain (for example, Teflon PFA)).

The conductive layer can be applied by laser direct structuring. Here, the substrate can comprise a laser direct structuring additive; and the laser direct structuring can comprise using a laser to irradiate the surface of the substrate, forming a track of the laser direct structuring additive, and applying a conductive metal to the track. The laser direct structuring additive can comprise a metal oxide particle (for example, titanium oxide and copper chromium oxide). The laser direct structuring additive can comprise a spinel-based inorganic metal oxide particle, for example, spinel copper. The metal oxide particle can be coated, for example, with a composition comprising tin and antimony (for example, 50 to 99 wt % of tin and 1 to 50 wt % of antimony, based on the total weight of the coating). The laser direct structuring additive can comprise 2 to 20 parts of the additive based on 100 parts of the respective composition. The irradiating can be performed with a YAG laser having a wavelength of 1,064 nanometers under an output power of 10 Watts, a frequency of 80 kHz, and a rate of 3 meters per second. The conductive metal can be applied using a plating process in an electroless plating bath comprising, for example, copper.

The conductive layer can be applied by adhesively applying the conductive layer. The conductive layer can be a circuit (the metallized layer of another circuit), for example, a flex circuit. An adhesion layer can be disposed between one or more conductive layers and the substrate. When appropriate, the adhesion layer can comprise a poly(arylene ether); and a carboxy-functionalized polybutadiene or polyisoprene polymer comprising butadiene, isoprene, or butadiene and isoprene units, and 0 to 50 wt % of co-curable monomer units. The adhesive layer can be present in an amount of 2 to 15 grams per square meter. The poly(arylene ether) can comprise a carboxy-functionalized poly(arylene ether). The poly(arylene ether) can be the reaction product of a poly(arylene ether) and a cyclic anhydride or the reaction product of a poly(arylene ether) and maleic anhydride. The carboxy-functionalized polybutadiene or polyisoprene polymer can be a carboxy-functionalized butadiene-styrene copolymer. The carboxy-functionalized polybutadiene or polyisoprene polymer can be the reaction product of a polybutadiene or polyisoprene polymer and a cyclic anhydride. The carboxy-functionalized polybutadiene or polyisoprene polymer can be a maleinized polybutadiene-styrene or a maleinized polyisoprene-styrene copolymer.

The thermoplastic composite can be used in electronic devices, for example, inductors on electronic integrated circuit chips, electronic circuits, electronic packages, modules, housings, transducers, ultra-high frequency (UHF) antennas, very high frequency (VHF) antennas, and microwave antennas for a wide variety of applications, for example, electric power applications, data storage, and microwave communication. The thermoplastic composite can be used in electronic devices, for example, mobile internet devices. The thermoplastic composite can be used in electronic devices, for example, cell phones, tablets, laptops, and internet watches. The thermoplastic composite can be used in applications where an external direct current magnetic field is applied. Additionally, the thermoplastic composite can be used with very good results (size and bandwidth) in all antenna designs over the frequency range of 1 to 10 GHz. The antenna can be a planar inverted-F antenna, a patch antenna, a dipole antenna, or a meander line antenna. The thermoplastic composite can be used in a radio-frequency (RF) component.

The thermoplastic composite can be used in three-dimensional (3D) printing processes. For example, the thermoplastic composite can be in the form of a filament or powder and the filament or powder can be used in 3D printing using the fused deposition modelling (FDM) method.

The following examples are provided to illustrate the thermoplastic composite. The examples are merely illustrative and are not intended to limit devices made in accordance with the disclosure to the materials, conditions, or process parameters set forth therein.

EXAMPLES

In the examples, following test methods were used to determine the specified properties.

The melt flow rate was determined in accordance with ASTM D1238-13, Procedure A, at a load of 2.16 kg at 400° C.

The viscosity data was determined in accordance with ASTM D3835-2016 at a temperature of 270° C.

TABLE 1

| | Example | | | | | |
|---|---|---|---|---|---|---|
| | 1 | 2 | 3 | 4 | 5 | 6 |
| Polyolefin (vol %) | 49.2 | 49.2 | 49.2 | 49.2 | 50.5 | 47.8 |
| $TiO_2$-3.5 (vol %) | — | — | — | 35.6 | — | — |
| $TiO_2$-2.7 (vol %) | — | 50.8 | 35.6 | — | 33.7 | 35.6 |
| $TiO_2$-0.2 (vol %) | 50.8 | — | 15.2 | 15.2 | 14.5 | 15.2 |
| Boron nitride (vol %) | — | — | — | — | 1.3 | — |
| Fluorogard ™ (vol %) | — | — | — | — | — | 1.4 |
| Melt flow rate (g/10 min) | 7.0 | 6.6 | 9.2 | 8.8 | 8.7 | 6.7 |
| Viscosity at 49 $s^{-1}$ (Pa · s) | 2,348 | 4,252 | 3,021 | 3,120 | 2,939 | 2,905 |
| Viscosity at 100 $s^{-1}$ (Pa · s) | 1,648 | 3,064 | 2,196 | 2,248 | 2,122 | 2,094 |
| Viscosity at 494 $s^{-1}$ (Pa · s) | 741 | 1,272 | 1,006 | 993 | 973 | 947 |
| Viscosity at 3,020 $s^{-1}$ (Pa · s) | 286 | 453 | 340 | 347 | 336 | 335 |
| Failure mode | Brittle | Brittle | Ductile | Ductile | Ductile | Ductile |

Examples 1-6

Effect of a Bimodal Distribution of the Dielectric Filler on Olefin Compositions Thermoplastic composites were prepared comprising a cyclic olefin copolymer comprising repeats derived from norbornene and ethylene and varying amounts of dielectric filler are shown in Table 1. In the table, $TiO_2$-3.5 is titanium dioxide having an average particle size of 3.5 micrometers, $TiO_2$-2.7 is titanium dioxide having an average particle size of 2.7 micrometers, and $TiO_2$-0.2 is titanium dioxide having an average particle size of 0.2 micrometers.

Table 1 shows that when the thermoplastic composite comprises a multimodal particle size distribution of the dielectric filler that a surprising decrease in the viscosity was achieved, almost to the levels of Example 1 comprising only the sub-micron titanium dioxide. Looking at the viscosity data taken at a frequency of 49 $s^{-1}$, Example 1 comprising only the 0.2 micrometer titanium dioxide achieved a viscosity of 2,348 Pa·s, but displayed a brittle failure mode. Example 2 illustrates that increasing the particle size of the titanium dioxide resulted in an increase in the viscosity to 4,252 Pa·s. Comparing Example 2 with Examples 3 and 4, it can be observed that by using a bimodal particle size distribution of the titanium dioxide, the viscosity could be reduced by almost 30%, and beneficially changed the failure mode to a ductile failure mode. Examples 5 and 6 illustrate that using a flow modifier can beneficially result in an even further reduction in the viscosity by another 5% or more, while maintaining the ductile failure mode.

Example 7

Effect of Filler Modality and Amount in a Cyclic Olefin Copolymer Composition Thermoplastic composites were prepared comprising a cyclic olefin copolymer comprising repeats derived from norbornene and ethylene and varying amounts of dielectric filler. The dielectric constant at 10 GHz was determined for the various compositions and the results are illustrated in FIG. 1.

Figure 1:
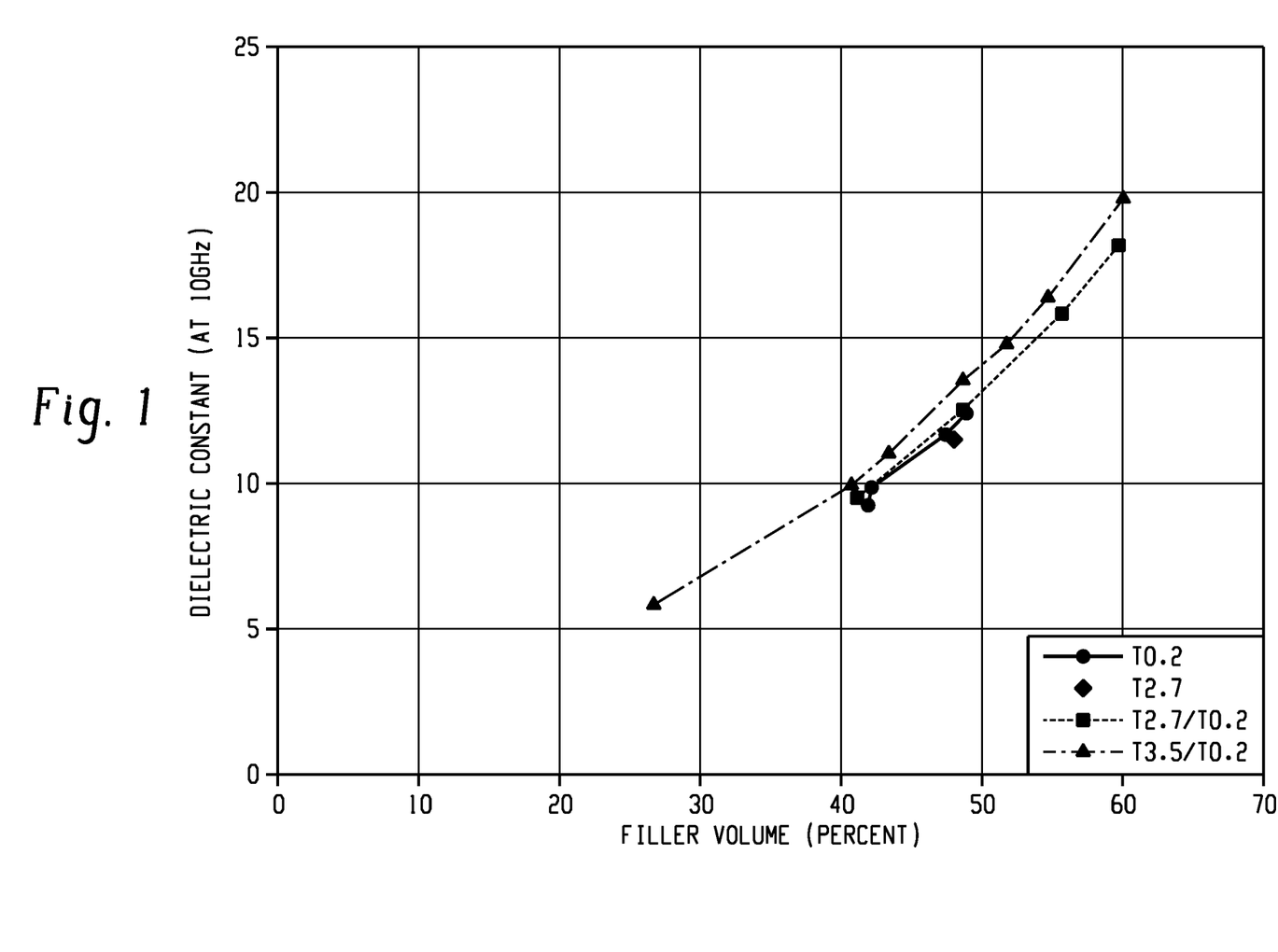
FIG. 1 is a graphical illustration of the dielectric constant versus filler volume of Example 7.

FIG. 1 shows that the compositions comprising only one particle size of the titanium dioxide were not able to achieve the high loadings of more than 50 vol %. Conversely, the compositions comprising a dielectric filler having a multimodal particle size distribution were capable of achieving increased loadings of 50 to 60 vol %. FIG. 1 further illustrates the surprisingly high dielectric constant that is achieved the compositions comprising the dielectric filler having a multimodal particle size distribution. For example, FIG. 1 shows several compositions achieving a dielectric constant of greater than or equal to 15 to almost 20 at 10 GHz at 23° C.

Example 8

Effect of Filler Modality and Amount in a Poly(Ether Ether Ketone) Composition Thermoplastic composites were prepared comprising a poly(ether ether ketone) and varying amounts of dielectric filler. The dielectric constant at 10 GHz was determined for the various compositions and the results are illustrated in FIG. 2.

Figure 2:
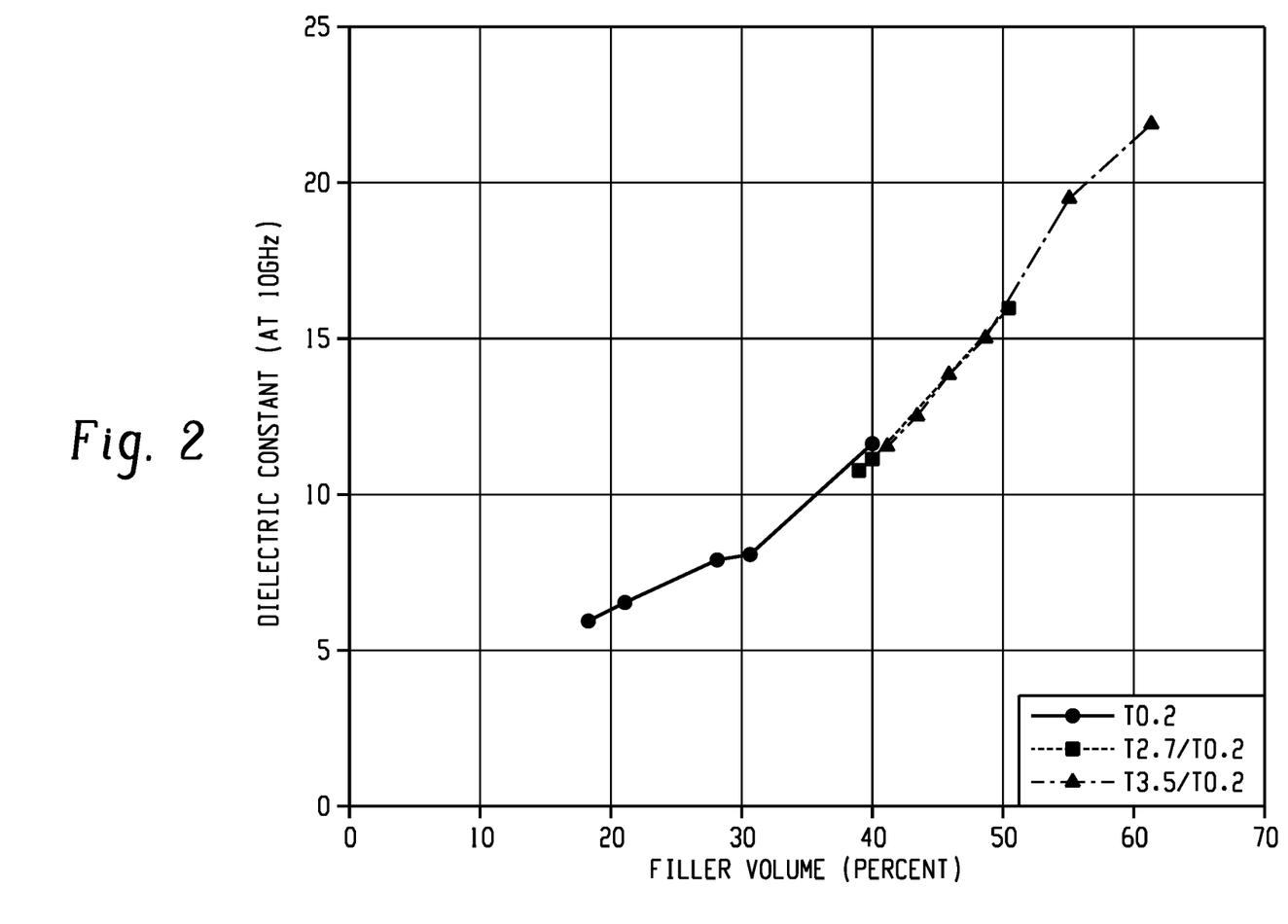
FIG. 2 is a graphical illustration of the dielectric constant versus filler volume of Example 8.

FIG. 2 shows that the compositions comprising only one particle size of the titanium dioxide were not able to achieve the high loadings of more than 40 vol %. Conversely, the compositions comprising a dielectric filler having a multimodal particle size distribution were capable of achieving increased loadings of 50 to over 60 vol %. FIG. 2 further illustrates the surprisingly high dielectric constant that is achieved the compositions comprising the dielectric filler having a multimodal particle size distribution. For example, FIG. 2 shows several compositions achieving a dielectric constant of greater than or equal to 13 to more than 20 at 10 GHz at 23° C.

Examples 9-13

Effect of Filler Modality on Fill-Ability in a Poly(Ether Ether Ketone) Composition Five poly(ether ether ketone) compositions were prepared having the filler compositions as illustrated in Table 2, where the relative amounts of the fillers is based on the total filler volume. The total amount of the filler is based on the total volume of the compositions and was adjusted to target a dielectric constant of 15 at 10 GHz at 23° C.

Each of the compositions was injection molded to mold a plaque having dimensions of 2 inches (5.08 centimeters)×3 inches (7.62 centimeters)×0.125 inches (0.3175 centimeters) at a barrel temperature of 470° C. and at varying injection pressures. Table 2 show the flow rate cubic centimeters per second (cc/sec) of the respective compositions when molded at a constant injection rate with respect to the total mold volume. For example, if a poly(ether ether ketone) composition filled the entire volume of the mold then the fill at that pressure is noted as 100%.

The plaques were molded using an injection molding machine where, similar to a conventional injection molding machine, a rotating screw heats the polymer and conveys it towards a nozzle, but when it comes time to inject the injection molding machine uses the rotating screw to inject the material into the mold. This injection approach is different from conventional injection molding machines that have a check ring that stops reverse flow and plunges the material forward with lateral movement of the screw. In the present injection molding machine, the temperature of the barrel (471° C.) and mold (177° C.), the screw RPM (which controls material flow) (50% of the maximum speed), and one of the injection time and injection pressure are controlled by the user. For these experiments, the injection molding machine was operated in pressure mode, where the screw was set to continue to spin and attempt to push material until the chosen pressure was reached. The fill volume achieved once the chosen pressures were reached are shown in Table 2. If a material created a full part, it was not molded at the higher pressures. Multiple parts were molded at each pressure for each material to ensure steady state and the volume of each material at each pressure was calculated (weight divided by density). The average of each part for each material was then compared. The material with the largest volume at the lowest pressure is the easiest to mold and is assumed to have the highest flowrate. To determine the flowrate, the volume (including sprue and runner) is graphed against the injection time for each molded sample at all injection pressures. The slope of the resulting trendline for each material was taken to be the flowrate.

TABLE 2

| Example | 9 | 10 | 11 | 12 | 13 |
|---|---|---|---|---|---|
| $TiO_2$-14.7 (vol %) | — | — | — | — | 70 |
| $TiO_2$-3.5 (vol %) | 100 | 70 | 30 | — | — |
| $TiO_2$-0.2 (vol %) | — | 30 | 70 | 100 | 30 |
| Total filler volume (vol %) | 46 | 48 | 49 | 50 | 47 |
| Particle size ratio | — | 16.8 | 16.8 | — | 66.9 |
| Dielectric constant | 14.46 | 15.31 | 15.70 | 14.20 | 14.90 |
| Flow rate (cc/sec) | 3.18 | 4.40 | 3.97 | — | 4.04 |
| Fill at 6.9 MPa (vol %) | 35 | 46 | 31 | 0 | 44 |
| Fill at 8.6 MPa (vol %) | 69 | 85 | 67 | 0 | 82 |
| Fill at 10.3 MPa (vol %) | 71 | 92 | 74 | 0 | 87 |
| Fill at 12.1 MPa (vol %) | 87 | 100 | 95 | 0 | 100 |
| Fill at 13.8 MPa (vol %) | 100 | — | 100 | 51 | — |
| Fill at 18.6 MPa (vol %) | — | — | — | 100 | — |

Table 2 shows that by utilizing a multimodal fill composition, the flow rate of the composition into the mold can be increased and the pressure needed to fill 100% of the mold can be reduced. For example, Examples 10 and 11 that have a bimodal particle size distribution of the titanium dioxide had increased flow rates as compared to Example 9 comprising only the large particle size titanium dioxide and a reduced fill pressure needed to fill 100% of the mold as compared to Example 9 and Example 10 comprising only the small particle size titanium dioxide. Regarding Example 10, it is noted that at fill pressures of 12.1 and below, the composition was not melt processable and could not be injection molded and required a significantly higher fill pressure to achieve a 100% fill. Table 2 also shows that the composition of Example 10 had the highest flow rate of all of Examples 9-13 illustrating its excellent flowability.

Set forth below are non-limiting aspects of the present disclosure.

Aspect 1: A thermoplastic composite comprising: a thermoplastic polymer; and a dielectric filler having a multimodal particle size distribution; wherein a peak of a first mode of the multimodal particle size distribution is at least seven times that of a peak of a second mode of the multimodal particle size distribution; and a flow modifier.

Aspect 2: The thermoplastic composite of Aspect 1, wherein the thermoplastic composite has a dielectric constant of greater than or equal to 5, preferably, 10 to 20 at 500 MHz to 10 GHz, or 15 to 25 at 500 MHz to 10 GHz; and a dielectric loss of less than or equal to 0.007 at 500 MHz to 10 GHz Aspect 3: The thermoplastic composite of any one or more of the preceding aspects, wherein the thermoplastic polymer comprises a poly(aryl)etherketone, a polysulfone, a poly(phenylene sulfide), a poly(ether imide), a poly(amide imide), a fluoropolymer, a polyolefin, or a combination comprising at least one of the foregoing.

Aspect 4: The thermoplastic composite of any one or more of the preceding aspects, wherein the thermoplastic polymer comprises a poly(ether ether ketone), a polyethylene, a poly(phenylene oxide), a cyclic olefin copolymer, or a combination comprising at least one of the foregoing.

Aspect 5: The thermoplastic composite of any one or more of the preceding aspects, wherein the thermoplastic composite comprises 10 to 90 vol %, or 20 to 80 vol %, or 20 to 70 vol %, or 30 to 50 vol % of the thermoplastic polymer based on a total volume of the thermoplastic composite.

Aspect 6: The thermoplastic composite of any one or more of the preceding aspects, wherein the thermoplastic polymer comprises or consists of a liquid crystalline polymer.

Aspect 7: The thermoplastic composite of Aspect 6, wherein the liquid crystalline polymer comprises a liquid crystalline polyester.

Aspect 8: The thermoplastic composite of any one or more of the preceding aspects, wherein the dielectric filler comprises titanium dioxide, barium titanate, strontium titanate, silica, corundum, wollastonite, boron nitride, aluminum oxide, aluminum nitride, silicon carbide, beryllia, magnesia, silica, or a combination comprising at least one of the foregoing.

Aspect 9: The thermoplastic composite of any one or more of the preceding aspects, wherein the dielectric filler comprises titanium dioxide.

Aspect 10: The thermoplastic composite of any one or more of the preceding aspects, wherein the dielectric filler comprises silica.

Aspect 11: The thermoplastic composite of any one or more of the preceding aspects, wherein the dielectric filler comprises a first plurality of particles having a first average particle size and a second plurality of particles having a second average particle size; wherein the first average particle size corresponds to the peak of the first mode and the second average particle size corresponds to the peak of the second mode; and wherein the peak of the first mode of the multimodal particle size distribution is 10 to 20 times that of the peak of the second mode of the multimodal particle size distribution.

Aspect 12: The thermoplastic composite of Aspect 11, wherein the first plurality of particles comprises silica and the second plurality of particles comprises titanium dioxide.

Aspect 13: The thermoplastic composite of Aspect 11, wherein the first plurality of particles and the second plurality of particles comprises titanium dioxide.

Aspect 14: The thermoplastic composite of any one or more of the preceding aspects, wherein the multimodal particle size distribution is bimodal or trimodal.

Aspect 15: The thermoplastic composite of any one or more of the preceding aspects, wherein the peak of the first mode is 1 to 10 micrometers and the peak of the second mode is 0.01 to 1 micrometers.

Aspect 16: The thermoplastic composite of any one or more of the preceding aspects, wherein the thermoplastic composite comprises 10 to 90 vol %, or 20 to 80 vol %, or 30 to 80 vol %, or 50 to 70 vol % of the dielectric filler based on a total weight of the thermoplastic composite.

Aspect 17: The thermoplastic composite of any one or more of the preceding aspects, wherein the flow modifier comprises a ceramic filler, a fluoropolymer, a silsesquioxane, or a combination comprising at least one of the foregoing.

Aspect 18: The thermoplastic composite of any one or more of the preceding aspects, wherein the flow modifier comprises a boron nitride, a fluoropolymer, trisilanolphenyl silsesquioxane, or a combination comprising at least one of the foregoing.

Aspect 19: The thermoplastic composite of any one or more of the preceding aspects, wherein the flow modifier is present in an amount of less than or equal to 5 vol %, or 0.5 to 5 vol %, or 0.5 to 2 vol % based on the total volume of the thermoplastic composite.

Aspect 20: An article comprising the thermoplastic composite of any one or more of the preceding aspects.

Aspect 21: The article of Aspect 20, wherein a conductive layer disposed on at least one side of the thermoplastic composite.

Aspect 22: The article of Aspect 20, wherein the article is an antenna, wherein the antenna is preferably a planar inverted-F antenna, a patch antenna, a dipole antenna, or a meander line antenna.

Aspect 23: The article of Aspect 20, wherein the article is a filament or powder for 3D printing.

Aspect 24: A method of forming the article of any one of Aspects 20 to 24 comprising: injecting the thermoplastic composite of any one of or more of aspects 1 to 19 in a molten form into a mold; and cooling the mold to form the article.

Aspect 25: A method of forming the article of any one of Aspects 20 to 24 comprising: melting the thermoplastic composite of any one of or more of Aspects 1 to 19 to form a molten thermoplastic composite; and printing the article in a layer-by-layer manner with an additive manufacturing system.

Aspect 26: A method of forming the thermoplastic composite of any one of Aspects 1 to 19 comprising extruding the thermoplastic composite.

Aspect 27: The thermoplastic composite of any one of the preceding aspects, wherein the thermoplastic composite, for example, comprising a polyolefin, has a viscosity of less than or equal to 3,000 Pa·s determined in accordance with ASTM D3835 measured at a frequency of 49 $s^{-1}$ at a temperature of 270° C.

Aspect 28: The thermoplastic composite of any one of the preceding aspects, wherein the thermoplastic composite has one or more of, or two or more of a viscosity of less than or equal to 3,000 Pa·s determined in accordance with ASTM D3835 measured at a frequency of 49 $s^{-1}$ at a temperature of 270° C.; a ductile failure mode; a dielectric constant of greater than or equal to 5, or 10 to 20 at 500 MHz to 10 GHz; and a dielectric loss of less than or equal to 0.007 at 500 MHz to 10 GHz.

Aspect 29: The thermoplastic composite of any one of Aspects 11 to 13, wherein the thermoplastic composite comprises 10 to 90 vol %, or 50 to 90 vol %, or 60 to 80 vol % of the first plurality of particles and 10 to 90 vol %, or 10 to 50 vol %, or 20 to 40 vol % of the second plurality of particles; both based on the total volume of the dielectric filler.

Aspect 30: The thermoplastic composite of any one of Aspects 11 to 13 and 29, wherein the thermoplastic composite comprises 25 to 45 vol %, or 30 to 40 vol % of the first plurality of particles and 10 to 25 vol %, or 10 to 20 vol % of the second plurality of particles; both based on the total volume of the thermoplastic composite.

Aspect 31: The thermoplastic composite of any one of the preceding aspects, wherein the thermoplastic composite comprises 45 to 90 vol % of the dielectric filler based on the total volume of the thermoplastic composite.

Aspect 32: The thermoplastic composite of any one of the preceding aspects, wherein the thermoplastic composite has an improved moldability, for example, as evidenced by at least one of a reduced viscosity, a smoother molded surface, and ductile failure mode as compared to a corresponding composition, but comprising only a single modal dielectric filler.

The compositions, methods, and articles can alternatively comprise, consist of, or consist essentially of, any appropriate materials, steps, or components herein disclosed. The compositions, methods, and articles can additionally, or alternatively, be formulated so as to be devoid, or substantially free, of any materials (or species), steps, or components, that are otherwise not necessary to the achievement of the function or objectives of the compositions, methods, and articles.

The terms "a" and "an" do not denote a limitation of quantity, but rather denote the presence of at least one of the referenced item. The term "or" means "and/or" unless clearly indicated otherwise by context. Reference throughout the specification to "an aspect", "an embodiment", "another embodiment", "some embodiments", and so forth, means that a particular element (for example, feature, structure, step, or characteristic) described in connection with the embodiment is included in at least one embodiment described herein, and may or may not be present in other embodiments. In addition, it is to be understood that the described elements may be combined in any suitable manner in the various embodiments. "Optional" or "optionally" means that the subsequently described event or circumstance may or may not occur, and that the description includes instances where the event occurs and instances where it does not. The terms "first," "second," and the like, "primary," "secondary," and the like, as used herein do not denote any order, quantity, or importance, but rather are used to distinguish one element from another. The term "combination" is inclusive of blends, mixtures, alloys, reaction products, and the like. "Layer" as used herein includes planar films, sheets, and the like, as well as other three-dimensional non-planar forms. A layer can further be macroscopically continuous or non-continuous. Also, "combinations comprising at least one of the foregoing" means that the list is inclusive of each element individually, as well as combinations of two or more elements of the list, and combinations of at least one element of the list with like elements not named.

In general, the compositions, methods, and articles can alternatively comprise, consist of, or consist essentially of, any ingredients, steps, or components herein disclosed. The compositions, methods, and articles can additionally, or alternatively, be formulated, conducted, or manufactured so as to be devoid, or substantially free, of any ingredients, steps, or components not necessary to the achievement of the function or objectives of the present claims.

Unless specified to the contrary herein, all test standards are the most recent standard in effect as of the filing date of this application, or, if priority is claimed, the filing date of the earliest priority application in which the test standard appears.

The endpoints of all ranges directed to the same component or property are inclusive of the endpoints, are independently combinable, and include all intermediate points. For example, greater than or equal to 25 wt %, or 5 to 20 wt %" is inclusive of the endpoints and all intermediate values of the ranges of "5 to 25 wt %," for example, 10 to 23 wt %, etc.

Unless defined otherwise, technical and scientific terms used herein have the same meaning as is commonly understood by one of skill in the art to which this disclosure belongs. All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A melt processable thermoplastic composite comprising:
    a thermoplastic polymer;
    a dielectric filler having a multimodal particle size distribution; wherein a peak of a first mode of the multimodal particle size distribution is at least seven times that of a peak of a second mode of the multimodal particle size distribution; wherein the dielectric filler comprises silica; and
    a flow modifier.

2. The melt processable thermoplastic composite of claim 1, wherein the thermoplastic composite has a dielectric constant of greater than or equal to 5 at 500 MHz to 10 GHz and a dielectric loss of less than or equal to 0.007 at 500 MHz to 10 GHz.

3. The melt processable thermoplastic composite of claim 1, wherein the thermoplastic polymer comprises a poly(aryl) etherketone, a polysulfone, a poly(phenylene sulfide), a poly(ether imide), a poly(amide imide), a fluoropolymer, a polyolefin, or a combination comprising at least one of the foregoing.

4. The melt processable thermoplastic composite of claim 1, wherein the thermoplastic polymer comprises a poly(ether ether ketone), a polyethylene, a poly(phenylene oxide), a cyclic olefin copolymer, or a combination comprising at least one of the foregoing.

5. The melt processable thermoplastic composite of claim 1, wherein the thermoplastic composite comprises 10 to 90 vol % of the thermoplastic polymer based on a total volume of the thermoplastic composite.

6. The melt processable thermoplastic composite of claim 1, wherein the thermoplastic polymer comprises or consists of a liquid crystalline polymer.

7. The melt processable thermoplastic composite of claim 1, wherein the dielectric filler comprises titanium dioxide, barium titanate, strontium titanate, corundum, wollastonite, boron nitride, aluminum oxide, aluminum nitride, silicon carbide, beryllia, magnesia, or a combination comprising at least one of the foregoing.

8. The melt processable thermoplastic composite of claim 1, wherein the dielectric filler comprises a first plurality of particles having a first average particle size and a second plurality of particles having a second average particle size; wherein the first average particle size corresponds to the peak of the first mode and the second average particle size corresponds to the peak of the second mode; and wherein the peak of the first mode of the multimodal particle size distribution is 10 to 20 times that of the peak of the second mode of the multimodal particle size distribution.

9. The melt processable thermoplastic composite of claim 8, wherein the first plurality of particles comprises silica and the second plurality of particles comprises titanium dioxide.

10. The melt processable thermoplastic composite of claim 8, wherein the first plurality of particles and the second plurality of particles comprises titanium dioxide.

11. The melt processable thermoplastic composite of claim 1, wherein the multimodal particle size distribution is bimodal or trimodal.

12. The melt processable thermoplastic composite of claim 1, wherein the peak of the first mode is 1 to 10 micrometers and the peak of the second mode is 0.01 to 1 micrometers.

13. The melt processable thermoplastic composite of claim 1, wherein the thermoplastic composite comprises 10 to 90 vol % of the dielectric filler based on a total weight of the thermoplastic composite.

14. The melt processable thermoplastic composite of claim 1, wherein the flow modifier comprises a ceramic filler, a fluoropolymer, a silsesquioxane, or a combination comprising at least one of the foregoing.

15. The melt processable thermoplastic composite of claim 1, wherein the flow modifier is present in an amount of 0.5 to 5 vol % based on the total volume of the thermoplastic composite.

16. A melt processable thermoplastic composite comprising:
   10 to 90 vol % a thermoplastic polymer based on a total weight of the thermoplastic composite comprising a poly(aryl)etherketone, a polysulfone, a poly(phenylene sulfide), a poly(ether imide), a poly(amide imide), a fluoropolymer, a polyolefin, a liquid crystalline polymer, or a combination comprising at least one of the foregoing;
   10 to 90 vol % a dielectric filler based on a total weight of the thermoplastic composite having a multimodal particle size distribution; wherein a peak of a first mode of the multimodal particle size distribution is at 10 to 20 times that of a peak of a second mode of the multimodal particle size distribution; wherein the dielectric filler comprises titanium dioxide, barium titanate, strontium titanate, silica, corundum, wollastonite, boron nitride, aluminum oxide, aluminum nitride, silicon carbide, beryllia, magnesia, or a combination comprising at least one of the foregoing; and
   0.5 to 5 vol % of a flow modifier based on the total volume of the thermoplastic composite;
   wherein the thermoplastic composite has a dielectric constant of greater than or equal to 5 at 500 MHz to 10 GHz and a dielectric loss of less than or equal to 0.007 at 500 MHz to 10 GHz.

17. An article comprising the melt processable thermoplastic composite of claim 1, wherein the article optionally comprises a conductive layer disposed on at least one side of the melt processable thermoplastic composite.

18. The article of claim 17, wherein the article is an antenna.

19. A method of forming an article comprising:
   injection molding, extruding, or layer-by-layer printing the melt processable thermoplastic composite of claim 1.

20. A melt processable thermoplastic composite comprising:
   10 to 90 vol % a thermoplastic polymer based on a total weight of the thermoplastic composite comprising a polystyrene, a poly(phenylene ether), or a combination comprising at least one of the foregoing;
   10 to 90 vol % a dielectric filler based on a total weight of the thermoplastic composite having a multimodal particle size distribution; wherein a peak of a first mode of the multimodal particle size distribution is at 10 to 20 times that of a peak of a second mode of the multimodal particle size distribution; wherein the dielectric filler comprises titanium dioxide, barium titanate, strontium titanate, silica, corundum, wollastonite, boron nitride, aluminum oxide, aluminum nitride, silicon carbide, beryllia, magnesia, silica, or a combination comprising at least one of the foregoing; and
   0.5 to 5 vol % of a flow modifier based on the total volume of the thermoplastic composite;
   wherein the thermoplastic composite has a dielectric constant of greater than or equal to 5 at 500 MHz to 10 GHz and a dielectric loss of less than or equal to 0.007 at 500 MHz to 10 GHz.

* * * * *

UNITED STATES PATENT AND TRADEMARK OFFICE
CERTIFICATE OF CORRECTION

PATENT NO. : 11,198,263 B2  
APPLICATION NO. : 16/357929  
DATED : December 14, 2021  
INVENTOR(S) : Stephen O'Connor Page 1 of 1

It is certified that error appears in the above-identified patent and that said Letters Patent is hereby corrected as shown below:

In the Claims

In Column 19, Line 35, in Claim 13, change the word "weight" to "volume"
In Column 19, Line 48, in Claim 16, change the word "weight" to "volume"
In Column 20, Line 1, in Claim 16, change the word "weight" to "volume"
In Column 20, Line 32, in Claim 20, change the word "weight" to "volume"
In Column 20, Line 35, in Claim 20, change the word "weight" to "volume"

Signed and Sealed this
Twenty-sixth Day of April, 2022

Katherine Kelly Vidal
*Director of the United States Patent and Trademark Office*